Dec. 5, 1967 H. H. EDWARDS ET AL 3,356,960

SUPERCONDUCTING AMPLIFIER

Filed Oct. 17, 1963 2 Sheets-Sheet 1

Inventors:
Harold H. Edwards;
Vernon L. Newhouse,
by John P. DeWitt
Their Attorney.

SUPERCONDUCTING AMPLIFIER

Filed Oct. 17, 1963

Inventors:
Harold H. Edwards;
Vernon L. Newhouse,
by John P. Dellitt
Their Attorney.

United States Patent Office
3,356,960
Patented Dec. 5, 1967

3,356,960

SUPERCONDUCTING AMPLIFIER

Harold H. Edwards, Schenectady, and Vernon L. Newhouse, Scotia, N.Y., assignors to General Electric Company, a corporation of New York Filed Oct. 17, 1963, Ser. No. 316,918
7 Claims. (Cl. 330—61)

Figure 1:
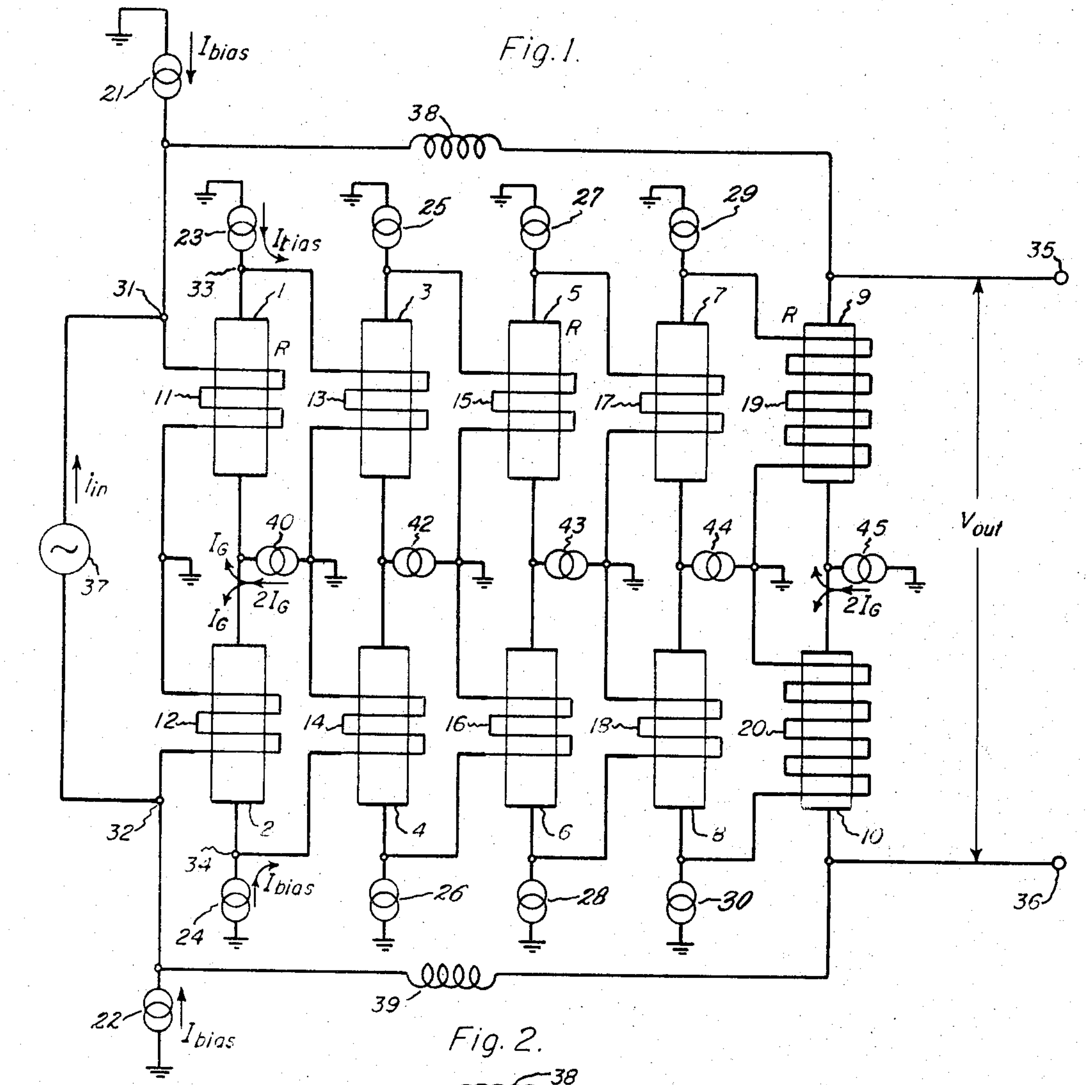

This invention relates to superconducting amplifiers and more particularly to multistage high gain superconducting amplifiers.

Superconductivity is that property exhibited by certain metals of losing substantially all electrical resistance at low temperatures near absolute zero. Among such metals are niobium, lead, tantalum, tin, vanadium and mercury. A number of alloys and compounds also exhibit superconductive properties. As a conductor formed of one of these materials is lowered in temperature, the resistance drops more or less uniformly until a temperature is reached at which resistance suddenly disappears. This temperature is a property of the particular material and is called the critical temperature for the material. Below this temperature resistance may be restored by subjecting the conductor to a magnetic field. In addition, resistance may also be restored at temperatures below the critical temperature by means of passing a current through the conductor in excess of a designated critical current. The critical current reestablishes resistance, in large part because of the magnetic field associated with the current.

Practical superconducting devices have been developed which enable operation of entire circuits at extremely low or superconducting temperatures, conventionally near the boiling temperature of liquid helium (4.2° Kelvin). Such circuitry is largely lossless, containing a majority of zero resistance components and interconnections; therefore the superconducting circuits and elements may be greatly miniaturized with many thousands accommodated per cubic foot. Thus far, most common superconducting circuits involve simple cryogenic switching circuits. In switch elements, called cryotrons, a current in a superconductor called a gate is effectively turned on and off by means of a closely proximate magnetic field. The magnetic field is generated with another superconductor called a control grid or simply a grid. It is advantageous to provide more sophisticated and complex circuitry at the superconducting level in order to more fully achieve circuit completeness and compactness, as well as to prevent a multiplicity of interconnections between the superconducting circuit and non-superconducting circuitry. One such needful circuit is a superconducting amplifier for use in amplifying weak signals derived from cryogenic switching circuitry and otherwise.

Superconducting amplifiers may be conveniently formed of one or more cryotron-type device biased to operate in a region in between complete superconductivity and normal resistance. A cryotron's resistance changes quite rapidly with grid current in this region and hence considerable amplification should be achieved, especially when several such devices are coupled in cascade. However, when several cryotron amplifier stages are thus cascaded, the amplifier tends to be self-driven out of the high gain region, rendering the amplifier unstable. We have discovered the instability is caused by low frequency noise voltages, believed attributable to small temperature fluctuations in the cryogenic environment of the device.

It is accordingly an object of the present invention to provide an improved high-gain multistage amplifier device capable of stable high-gain operation.

Briefly stated in accordance with the illustrated embodiment of the present invention, a plurality of cascaded superconducting amplifier stages each comprise a pair of cryotrons, having their gates connected in series, driving a second stage of similar cryotrons whose grids are coupled in series across the cryotron gates of the first stage. The output of a plurality of such stages is coupled back to the input of a first stage via a pair of inductances furnishing negative feedback in the low frequency range of the objectionable noise. The amplifier is rendered stable in this manner. However, the gain of the amplifier is not compromised at the higher frequencies of primary interest in such a device.

Figure 2:
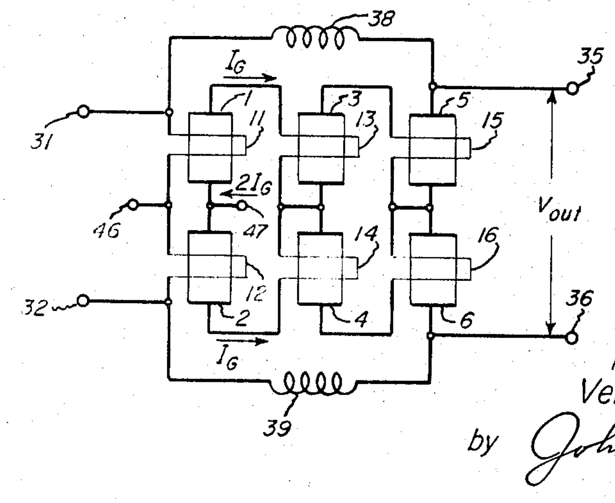
Figure 3:
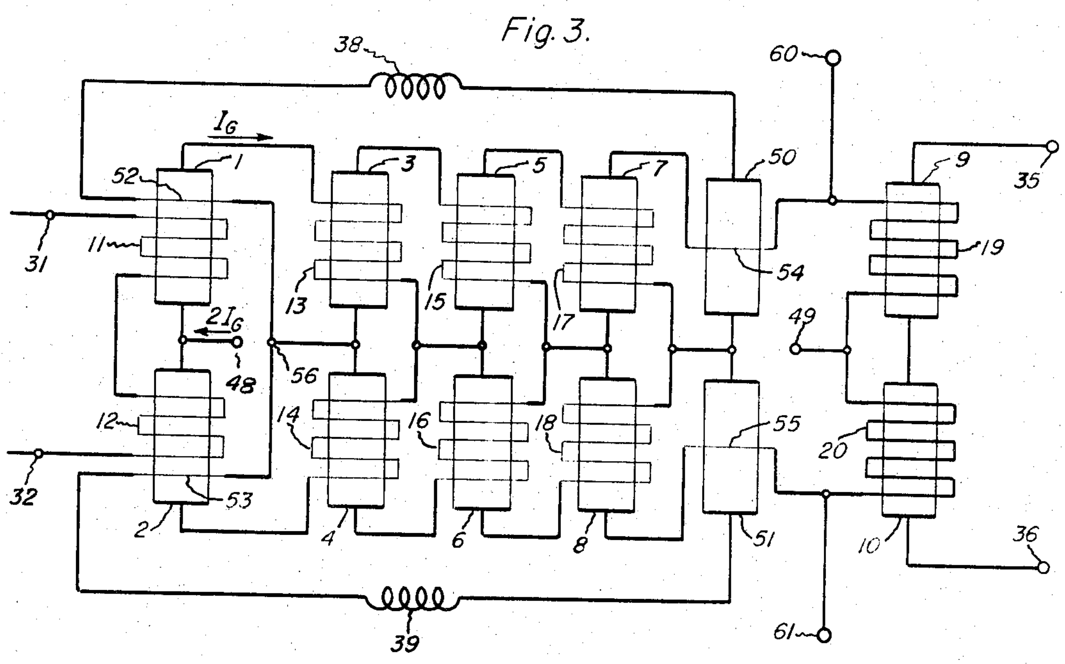
Figure 4:
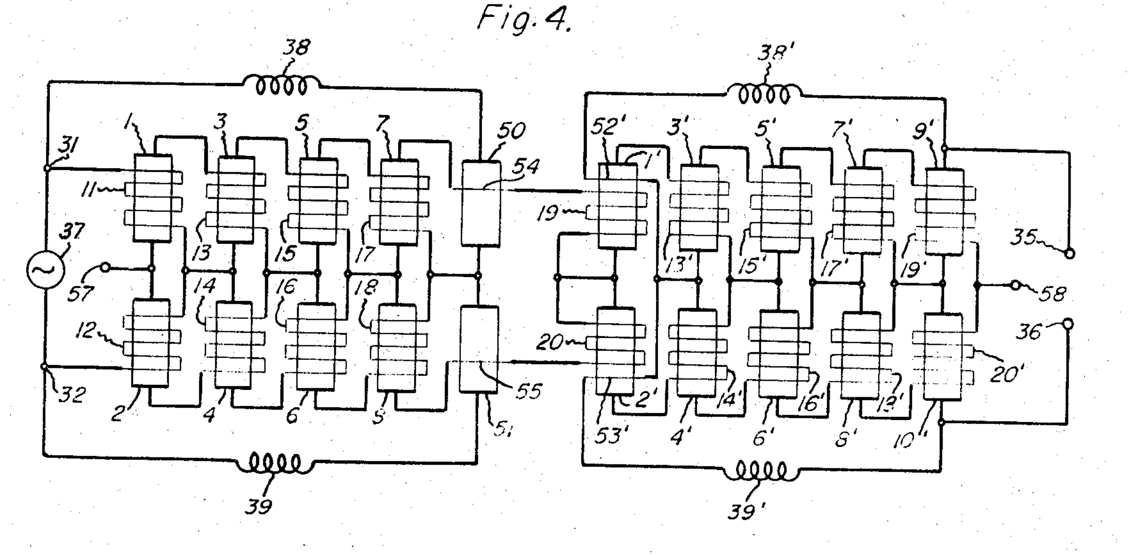

The subject matter which we regard as our invention is particularly pointed out and distinctly claimed in the concluding portion of this specification. The invention, however, both as to organization and method of operation, together with further objects and advantages thereof, may best be understood by reference to the following description taken in connection with the accompanying drawings wherein like reference characters refer to like elements and in which:

FIG. 1 is a schematic diagram of a first embodiment of the present invention,

FIG. 2 is a schematic diagram of a second embodiment of the present invention illustrating use of a single direct current path, FIG. 3 is a schematic diagram of a third embodiment of the invention employing separate feedback and output cryotrons as well as separate feedback input grids, and FIG. 4 is a schematic diagram of yet another embodiment of the present invention illustrating two cascade amplifiers employing a common D.C. bias path throughout.

Referring to FIG. 1 a plurality of cryotrons employed in the amplifier according to the present invention include gate conductors, 1–10, and respective control grid conductors, 11–20, each disposed for applying a magnetic field to the respective gate conductors. The gate conductors are formed of a "soft" superconducting material, e.g. tin, while the control grids are formed of a "hard" superconducting material, for example lead, or a similar material capable of retaining superconductivity while generating a magnetic field for driving the "soft" gates normally resistive. All interconnections are hard superconductor material and the entire amplifier is maintained at a superconductive temperature for the materials used by means not shown. The temperature of liquid helium at a pressure reduced from atmospheric value is suitable, being slightly below the critical temperature for the tin or soft superconducting material.

Cryotron gates 1 and 2, connected in series, comprise a first amplifier stage. Respective control grids 11 and 12 are also in series, with their intermediate interconnection preferably returned to ground. A current source 21 supplies bias current $I_{bias}$ to the ungrounded end of control grid 11. This source 21 supplies a portion of the current through the grid 11 which is required to operate the underlying gate between a condition of complete superconductivity on the one hand, and a condition of normal resistance. The total current through each grid desirably dictates operation in a region where resistance changes linearly with control grid current. A current source 22 biases control grid 12 similarly to the bias furnished to control grid 11 from current source 21. Also current sources 23–30 bias control grids 13–20 with a portion of the current necessary to provide linear cryotron operation.

A signal input source 37 couples a signal current, $i_{in}$, into the amplifier via input terminal 31 positioned at the ungrounded end of control grid 11, through control grids 11 and 12, and out through the remaining input terminal 32 at the ungrounded end of control grid 12. Signal current $i_{in}$ adds to $I_{bias}$ in control grid 11, but subtracts from $I_{bias}$ in control grid 12 providing a differential input for the amplifier. Successive stages of the amplifier are driven in a push-pull manner. Terminals 33 and 34 at either end of the series connection of gates 1 and 2 are considered output terminals of the first stage of the amplifier, as well as input terminals for the second stage of the amplifier; second stage grids 13 and 14 are serially connected therebetween. Again the midpoint between the two grids is returned to ground. Control grids for further stages of the amplifier are also serially coupled across the serially connected gates of the preceding stage. Final output terminals 35 and 36 connect across gates 9 and 10 of the last stage of the amplifier.

For each stage, one of the current sources 40 and 42–45 supplies gate current at the midpoint between two gates. Thus current source 40 supplies a current $2I_G$ to the interconnection between gates 1 and 2. Assuming equal resistance in each gate, that is assuming an absence of input signal, the current divides equally to a value $I_G$ for each gate. This value of current, $I_G$, then flows through each control grid of the following stage and is returned to ground at the grid interconnection. Therefore $I_G$ adds to the current $I_{bias}$ in the grids of the following stage, contributing the remaining portion of current necessary to operate the gates in the region where resistance varies linearly with control grid current. It will be noted $I_{bias}$ flows only through the grids without flowing through the shunting gates of the preceding stage because the grids are superconducting at all times while the gates are partially resistive.

According to a principal feature of the present invention a first feedback inductance 38 is interposed between output terminal 35 and amplifier input terminal 31. A similar feedback inductance 39 is connected between output terminal 36 and input terminal 32. The feedback loop conveniently includes an odd number of amplifier stages so that feedback is negative. While the feedback loop is shown as including all the stages of the amplifier, it is apparent the feedback loop may exist within the amplifier without necessarily including all the stages thereof; for example, the feedback loop might couple gate 8 to gate 4 and gate 7 to gate 3. Also the feedback loops may be cross-connected across an even number of stages. The feedback inductances 38 and 39 are formed of hard superconducting wire, e.g. lead or niobium, and are each air wound to have an inductance value for exhibiting substantial impedance at frequencies above approximately 1000 cycles. As will hereinafter become more evident, these inductances accomplish low frequency feedback and hence stabilization of the amplifier, but do not impair higher frequency gain.

In operation of the amplifier, a signal, $i_{in}$, adds to $I_{bias}$ in grid 11. Hence more resistance will appear in gate 1 than in gate 2. Therefore the current $2I_G$ will not divide equally between the two gates but a larger current will flow in lower resistance gate 2. This larger current is returned to ground through grid 14 of the following stage, while the lesser current is returned to ground through grid 13 of the same following stage. It follows that gate 4 will now be more resistive than gate 3, causing a larger proportion of current from source 42 to flow through gate 3 and through succeeding grid 15. In this manner, the remaining stages are driven in succession whereby an output voltage appears across output terminals 35 and 36.

Each stage of the amplifier provides amplification on account of the rather steep resistance vs. grid current characteristic of the cryotron, and because the control grids are narrow with respect to the cryotron gates, thereby generating a high intensity magnetic field across the gate. Current amplification is easily attained in each stage. However, a small input signal requires a plurality of stages for effective signal detection, each stage acting to further amplify the output of the preceding stage. A high degree of overall current amplification should be thereby attained. However, when several such cascaded stages are operated together, low frequency noise voltage, attributable to temperature fluctuations and the like, drives the amplifier out of the high gain region. The circuit in accordance with the present invention eliminates this problem in providing the aforementioned negative feedback from the output of the amplifier to the input in the low frequency range of the noise. However, higher frequencies of interest are not similarly attenuated. The value of inductances 38 and 39 is determined so that the reciprocal of the time constant in each feedback loop is effectively greater than the frequency of the noise but less than the signal frequency. In actual practice the coils each typically exhibit an inductance on the order of $3\times10^2$ micro henries and frequencies above 1000 cycles are amplified without difficulty.

The effective feedback time constant is equal to $$\frac{L_f/R}{\text{total current gain}}$$

where L is the feedback inductance and and R is A.C. gate resistance of the feedback stage. It is desirable to make R small relative to the value of the inductance. Various modifications of the circuit hereinafter set forth facilitate independent adjustment of this time constant as will more fully appear.

It is convenient to employ the amplifier in accordance with the present invention for driving a higher impedance load, as for example a transsistor amplifier located outside the refrigerated region. The input impedance of such an external amplifier will always be high as compared to the output impedance of a superconducting amplifier; therefore the output stage of the superconducting amplifier is arranged to provide a higher output voltage than the previous stages, the primary function of which is current gain. From FIG. 1, it can be seen the control grids 19 and 20 of the output cryotrons are somewhat wider than grids of preceding stages while the number of crossings of grids 19 and 20 relative to the underlying gates are greater in number. As will be appreciated by those skilled in the art, the output voltage, $V_{out}$, across output terminals 35 and 36, is proportional to $n$, the number of grid crossings. However, the inductance, L, of the output circuit is proportional to $n/w$, where $w$ is the width of each grid crossing. Therefore, to retain L at a reasonable value for retaining high bandwidth, the width of output cryotron grid crossings is preferably increased, while to obtain a high output voltage the number of grid crossings is also increased. Making the grids wider even has a tendency to improve current gain.

The current gain of the output stage, as well as that of the previous stages, is found to increase with width, $w$, up to a width on the order of $10^2$ microns. Current gain, $g$, may be defined as $$\left(\frac{\partial I_G}{\partial C}\right)_{V_G}$$

$I_G$ equaling gate current and C, control current.

$$\left(\frac{\partial I_G}{\partial C}\right)_{V_G}=\left(\frac{\partial V_G}{\partial C}\right)_{I_G}\left(\frac{\partial I_G}{\partial V_G}\right)_C=\frac{r_c}{r_g}=g$$

where $r_c$ and $r_g$ are defined as control and gate A.C. resistances respectively, and $V_G$ equals gate voltage.

$$r_g=\left(\frac{\partial V_G}{\partial I_G}\right)_C$$

increases linearly with control width, $w$, but $$r_c=\left(\frac{\partial V_G}{\partial C}\right)_{I_G}$$

is found to increase more rapidly with control width up to about $10^2$ microns, and current gain is found to go up accordingly. Since inductance decreases with control width, the bandwidth of the FIG. 1 circuit is found to be approximately 500 kc. The grid width of grids 19 and 20 is approximately 200 microns, while the remaining grids are 100 microns in width. A disadvantage of the FIG. 1 circuit is the maintenance of separate grid bias and gate current supplies occasioned by higher grid current requirements of the wider grids. In subsequent embodiments, a single supply is employed for both grid bias and gate current.

The stages of this amplifier are seen to be arranged in a push-pull configuration to further aid in reduction in noise. Noise of a given polarity tends to be cancelled out in the balanced arrangement of the push-pull amplifier. Moreover the push-pull arrangement provides alternate current paths for the supply currents, $I_{bias}$ and $2I_G$. It is noted these sources are current sources and therefore in general require alternative paths; i.e. as one current branch becomes resistive or more resistive than the other branch, the extra current flows in the remaining branch. It is therefore convenient to arrange the cryotrons in pairs, dividing gate current therebetween.

As a consequence of push-pull operation, the cryotron having the greater resistance alternates from one stage to the next. Thus, as cryotron gate 2 becomes more resistive than cryotron gate 1 of the first stage in the FIG. 1 amplifier, cryotron gate 3 will likewise become more resistive, and so on. The feedback, in order to be negative, is desirably coupled in a return path including an odd number of stages. Alternatively the negative feedback connections may be reversed in proceeding from the last stage to the first stage of an amplifier having an even number of stages.

FIG. 2 illustrates a simplified version of the amplifier in accordance with the present invention, illustrating a simplified direct current or bias current path including all the gates and grids involved. In this embodiment, terminals 46 and 47 are provided for connection to a single current source, not shown. Starting at terminal 47, a current $2I_G$ divides between gate 1 and gate 2, after which two branch currents, $I_G$, flow through grids 13 and 14 of the next stage. The common connection between these two grids, rather than being returned to ground, is then coupled between gates 3 and 4 of that stage. After the current reaches this common interconnection, it again equals precisely $2I_G$ and may be divided in any manner in the following stage. The current then passes through grids 15 and 16 and thence through the underlying gates 5 and 6. At this point, feedback inductances 38 and 39 connect the D.C. current back to input grids 11 and 12, respectively, and out through terminal 46. In this arrangement a common source thus supplies both gate current and a grid bias current for each stage. As thus appears, the cryotrons in this type of embodiment should be designed having grids sufficiently narrow so the gate current will have a magnitude commensurate with bias requirements. The A.C. amplifying and feedback operation is substantially the same as hereinbefore described with respect to FIG. 1.

The embodiment of FIG. 3 is advantageous in that separate cryotrons are used for supplying output voltage, and for driving the feedback loop. Also separate feedback control grids are included across the gates of the first stage. This construction allows the needs of the separate functions of the amplifier, i.e. feedback and output voltage, to be satisfied substantially independently of one another. This FIG. 3 circuit is also characterized by a common gate and bias current path similar to that described in connection with the FIG. 2 embodiment, but one which facilitates the testing of the cryotron circuit for short circuits and the like. In this circuit a common D.C. path proceeds from the gates of a particular stage's cryotrons to the grids of the next succeeding stage's cryotrons without the grids and gates of the same stage being immediately interconnected in the same D.C. path.

Referring further to FIG. 3, D.C. current terminals 48 and 49 are coupled to a common D.C. current source, not shown. Starting from terminal 48, a current $2I_G$ divides between cryotron gates 1 and 2 and thence to the grids 13 and 14 of the next stage. The current at this time flows to the common interconnection between gates 5 and

6 rather than through gates 3 and 4 of the same stage. This D.C. current proceeds to pass through the grids 17 and 18, and then through gates 50 and 51, specifically designated as a feedback stage. Feedback inductances 38 and 39 are coupled from across series connected gates 50 and 51 to a pair of feedback grids 52 and 53 crossing input cryotron gates 1 and 2. The feedback inductances provide both a D.C. return current path as well as a feedback signal return path. Feedback grids 52 and 53 are coupled in series having a common interconnection at 56 joined to the interconnection between gates 3 and 4 of the next stage. From there on the D.C. current passes alternately through the gates of one stage and grids of the next until the remaining component paths are also included. Output cryotron grids 19 and 20 complete the circuit to D.C. terminal 49. The entire D.C. circuit path may be broken, as by disconnecting the feedback inductances, whereby the cryotrons are conveniently tested for short circuits between grids and gates; there should now be no direct connection therebetween. The widths of grids 19 and 20 are increased in this illustration, since additional bias is supplied thereto via terminals 60 and 61.

Feedback grids 52 and 53 are separate from input grids 11 and 12 of the input cryotrons. Likewise separate feedback cryotron gates 50 and 51 drive the feedback loop, rather than the output cryotrons. Therefore the output cryotrons can provide proper voltage for devices following the amplifier, while each feedback connection retains component values commensurate with a desirable time constant equal to $$\frac{L_f/R}{\text{total current gain}}$$

The resistances of gates 50 and 51 can be made low as by respectively providing only narrow grids 54 and 55 thereacross. Likewise the single crossing feedback input grids 52 and 53 reduce the circuit gain in the feedback loop, thus reducing the size of the denominator of the foregoing time constant. Either measure reduces the value of inductance required in the feedback circuit.

The FIG. 4 schematic diagram illustrates two multistage superconducting amplifier sections including two feedback loops. Each circuit is substantially the same in construction and operation as those previously described and likewise employs the same reference numerals for like components. The reference numerals are primed for the second amplifier portion. In the case of each amplifier section in the FIG. 4 circuit, five stages are included within the feedback loop, it being generally preferred to restrict the number of stages within the loop to a relatively small number so that an extensive phase shift will not result. Moreover, the current gain of a large number of stages tends to increase the cutoff frequency of low frequency feedback.

Again, a common D.C. path exists, in this case between terminal 57 and terminal 58. The D.C. path is common to both sections of the amplifier. This path extends from terminal 57, alternately passing through a pair of gates and then a pair of grids connected for driving the next following stage, until feedback cryotron gates 50 and 51 are reached. At this point the feedback path extends the D.C. path back to the input of the amplifier. The current proceeds through the alternate grids and gates remaining in the first amplifier section, which are those interleaved amongst the ones already included, whereupon the current flows in cryotron grids 19 and 20 extending over the input cryotron gates 1' and 2' in the second section of the amplifier. The D.C. current continues through gates 1' and 2' via their central connection, and in alternate grids and gates in the second amplifier section including output gates 9' and 10'. Separate feedback input grids 52' and 53' extending across input gates 1' and 2', receive input current via inductors 38' and 39' from gates 9' and 10', and the current path proceeds through the remaining alternate grids and gates to the aforementioned terminal 58.

In actual practice, each stage of the FIG. 4 circuit may include a larger number of grid crossings than the number illustrated in the drawing. Thirty is a typical number for all cryotrons including those in the output stage, but excepting those in the feedback circuit. In this manner, desirable output impedance matching is more easily achieved without employing wider controls and necessary additional bias.

With the amplifier according to the FIG. 4 embodiment, input current changes on the order of about 1 microampere are detectable, the amplifier exhibiting a bandwidth of approximately 50 kilocycles. When feeding a filter of bandwidth $\Delta f$ ($\Delta f$ being less than 50 kilocycles), centered on a frequency $f$, the minimum detectable voltage $v \approx 10^{-16} f (\Delta f)^{1/2}$, for frequencies in excses of about 1000 cycles. The feedback arrangement tends to reduce the gain only below this frequency, for feedback inductors having an inductance on the order of 300 microhenries.

While we have shown and described several embodiments of our invention, it will be apparent to those skilled in the art that many changes and modifications may be made without departing from our invention in its broader aspects; and we therefore intend the appended claims to cover all such changes and modifications as fall within the true spirit and scope of our invention.

What we claim as new and desire to secure by Letters Patent of the United States is:

1. A superconducting amplifier comprising a plurality of cryotron stages, a first of said stages being an input stage and each of said stages including a pair of cryotrons, each cryotron including a gate and a control grid wherein the said gates are connected in series in each stage, means coupling grids of each successive stage in series across the pair of cryotron gates of the previous stage, current generating means coupled to the control grid of each of said cryotrons for biasing the gate of each of said cryotrons to a region where resistance of said gate varies linearly with control grid current, and a pair of inductances for coupling low frequency output signals of said amplifier as obtained across a pair of said cryotron gates to cryotron control grids of a prior stage in said amplifier in order to suppress low frequency noise and thereby maintain said amplifier in its high gain region.

2. A multistage superconducting amplifier comprising a plurality of cryotrons each having a gate and a control grid, wherein each stage comprises a pair of cryotrons the gates of which are connected in push-pull driving relation to the grids of the succeeding stage, one of said stages being an output stage and one being an input stage, current generating means coupled to the control grid of each of said cryotrons for biasing the gate of each of said cryotrons to a region where resistance of said gate varies linearly with control grid current, and inductance means coupling low frequency signals from the cryotron gates of said output stage in negative feedback relation to the grids of said input stage in order to suppress low frequency noise and thereby maintain said amplifier in its high gain region.

3. A multistage superconducting amplifier wherein each stage comprises output terminals, input terminals, and a pair of cryotrons each having gates and control grids, the gates of said pair being connected in series between said output terminals and the grids of said pair being connected in series between said input terminals, said amplifier further comprising means coupling the input terminals of each stage except the first across the output terminals of the previous stage, a D.C. path joining the common connection between the cryotron grids of each stage to the common connection between the cryotron gates of another stage, a source of current in said D.C. path providing operating current to said cryotrons, a first inductance coupling one output terminal of a given stage to one input terminal of a prior stage, and a second inductance coupling the remaining output terminal of said given stage to the remaining input terminal of said prior stage, said inductances providing low frequency feedback between said given stage and said prior stage in order to suppress low frequency noise and thereby maintain said amplifier in its high gain region.

4. A multistage superconducting amplifier wherein each stage comprises output terminals, input terminals, and a pair of cryotrons each having gates and control grids, the gates of said pair being connected in series between said output terminals and the grids of said pair being connected in series between said input terminals, said amplifier further comprising means coupling the input terminals of each stage except the first across the output terminals of the previous stage, a common D.C. path including means coupling the common connection between the cryotron grids of each stage to the common connection between cryotron gates of the next stage, so as to alternately include grids and gates of said amplifier, said D.C. path providing operating currents for said cryotron gates as well as grid bias for biasing the operation of said cryotrons between maximum superconductivity and normal resistance, a first inductance coupling one output terminal of a given stage to one input terminal of a prior stage and a second inductance coupling the remaining output terminal of said given stage to the remaining input terminal of said prior stage, said inductances providing low frequency negative feedback between the given stage and said prior stage in order to suppress low frequency noise and thereby maintain said amplifier in its high gain region.

5. A multistage superconducting amplifier wherein each stage comprises output terminals, input terminals, and a pair of cryotrons each having gates and control grids, the gates of said pair being connected in series between said output terminals and the grids of said pair being connected in series between said input terminals, said amplifier further comprising means coupling the input terminals of each stage except the first across the output terminals of the previous stage, an output stage including a pair of cryotrons having plural grid crossings of a width wider than employed in cryotrons of said amplifier stages other than said output stage, a first inductance coupling low frequency output signals from one output terminal of a given stage to one input terminal of a prior stage and a second inductance coupling low frequency output signals from the remaining output terminal of said given stage to the remaining input terminal of said prior stage in order to suppress low frequency noise and thereby maintain said amplifier in its high gain region.

6. A multistage superconducting amplifier wherein each stage comprises output terminals, input terminals, and a pair of cryotrons each having gates and control grids, the gates of said pair being connected in series between said output terminals and the grids of said pair being connected in series between said input terminals, said amplifier further comprising means coupling the input terminals of each stage except the first across the output terminals of the previous stage, a separate pair of feedback cryotron gates connected in series, each of said feedback cryotron gates having grids disposed thereacross in series with the grids of the final stage, and a pair of inductances coupling low frequency signals from said feedback cryotron gates to cryotron control grids disposed across gates of a prior stage of said amplifier in order to suppress low frequency noise and thereby maintain said amplifier in its high gain region.

7. A multistage superconducting amplifier wherein each stage comprises output terminals, input terminals and a pair of cryotrons each having gates and control grids, the gates of said pair being connected in series between said output terminals and the grids of said pair being connected in series between said input terminals, said amplifier further comprising means coupling the input terminals of each stage except the first across the output terminals of the previous stage, an output stage including a pair of cryotrons having plural grid crossings of a width wider than employed in cryotrons of said amplifier other than said output stage, a separate pair of feedback cryotron gates connected in series and having grids disposed thereacross in series with the grids of said output stage, and a pair of inductances coupling low frequency signals from said feedback cryotron gates to cryotron control grids disposed across gates of a prior stage of said amplifier in order to suppress low frequency noise and thereby maintain said amplifier in its high gain region.

References Cited

UNITED STATES PATENTS

| | | | |
|---|---|---|---|
| 2,361,198 | 10/1944 | Harmon et al. | 330—81 |
| 2,979,665 | 4/1961 | Schayes | 330—81 X |
| 3,020,489 | 2/1962 | Walker et al. | 330—62 |

ROY LAKE, *Primary Examiner.*

NATHAN KAUFMAN, *Examiner.*